United States Patent
Brodine et al.

(10) Patent No.: US 9,443,752 B2
(45) Date of Patent: Sep. 13, 2016

(54) HIGH TEMPERATURE ANTI-DROOP END EFFECTOR FOR SUBSTRATE TRANSFER

(75) Inventors: Jeffrey A. Brodine, Los Gatos, CA (US); Domingo Guerra, Palo Alto, CA (US); Whitney B. Kroetz, Hutto, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 2576 days.

(21) Appl. No.: 12/044,401

(22) Filed: Mar. 7, 2008

(65) Prior Publication Data

US 2008/0219815 A1 Sep. 11, 2008

Related U.S. Application Data

(60) Provisional application No. 60/894,098, filed on Mar. 9, 2007.

(51) Int. Cl.
*B65H 1/00* (2006.01)
*H01L 21/687* (2006.01)
*H01L 21/677* (2006.01)

(52) U.S. Cl.
CPC ... *H01L 21/68707* (2013.01); *H01L 21/67742* (2013.01)

(58) Field of Classification Search
USPC ............................................. 414/935; 294/1.1
See application file for complete search history.

(56) References Cited

U.S. PATENT DOCUMENTS

| | | | |
|---|---|---|---|
| 5,746,460 A * | 5/1998 | Marohl et al. | 294/1.1 |
| 5,957,651 A | 9/1999 | Takebayashi et al. | |
| 5,961,380 A | 10/1999 | Togawa et al. | |
| 6,267,423 B1 | 7/2001 | Marohl et al. | |
| 6,409,453 B1 | 6/2002 | Brodine et al. | |
| 7,334,826 B2 * | 2/2008 | Woodruff et al. | 294/103.1 |
| 7,433,756 B2 * | 10/2008 | Rice et al. | 700/213 |
| 7,717,481 B2 * | 5/2010 | Ng | 294/1.1 |

(Continued)

FOREIGN PATENT DOCUMENTS

| | | |
|---|---|---|
| JP | 06-061331 A | 4/1994 |
| JP | 6-246658 | 9/1994 |

(Continued)

OTHER PUBLICATIONS

First Office Action dated Jun. 26, 2009 for Chinese Patent Application No. 200810007455.0.

(Continued)

*Primary Examiner* — Saul Rodriguez
*Assistant Examiner* — Willie Berry, Jr.
(74) *Attorney, Agent, or Firm* — Patterson & Sheridan, LLP

(57) ABSTRACT

Embodiments of the present invention relates to high temperature anti-droop end effectors for transferring semiconductor substrates. One embodiment of the present invention provides an end effector for using with a substrate handler. The end effector comprises a free end having a substrate supporting plane configured to support a substrate and positioned that substrate at a first angle relative to a horizontal plane. The end effector comprises a fixed end configured to be mounted to the substrate handler, wherein the end effector is mounted to the substrate handler at a position that the substrate supporting plane is at a second angle relative to the horizontal plane when no substrate is disposed on the free end, and the first angle is different from the second angle.

18 Claims, 6 Drawing Sheets

(56) References Cited

U.S. PATENT DOCUMENTS

| | | |
|---|---|---|
| 2003/0085582 A1 | 5/2003 | Woodruff et al. |
| 2005/0186063 A1 | 8/2005 | Rice et al. |
| 2006/0113806 A1* | 6/2006 | Tsuji et al. .................... 294/1.1 |
| 2006/0171561 A1* | 8/2006 | Ramsey et al. .............. 382/103 |
| 2006/0216137 A1 | 9/2006 | Sakata et al. |

FOREIGN PATENT DOCUMENTS

| | | |
|---|---|---|
| JP | 07-086372 A | 3/1995 |
| JP | 10-177999 A | 6/1998 |
| JP | 2001-077171 | 3/2001 |
| JP | 2002-504750 A | 2/2002 |
| JP | 2004-128021 | 4/2004 |
| JP | 2006-110662 A | 4/2006 |
| KR | 2001-34507 | 4/2001 |
| KR | 2006-53265 | 5/2006 |
| TW | 200506082 A | 2/2005 |
| WO | WO 99/43021 | 8/1999 |
| WO | 0212970 A1 | 2/2002 |

OTHER PUBLICATIONS

Office Action dated Feb. 1, 2010 for Korean Patent Application No. 10-2008-0021358.

European Search Report, European Application No. 08152541.2-1551, dated Jul. 11, 2013.

European Patent Office; Extended European Search Report Application No. 08152541.2-1551 / 1968110; 13 pages; Oct. 31, 2013.

Japanese Office Action (with attaches English translation) for Application No. 2008-57723 dated Dec. 17, 2014; 5 total pages.

Office Action dated Aug. 3, 2012 in Japanse Application No. 2008057723.

Japanese Office Action (with attached English translation) for Application No. 2008-057723; 4 total pages; Sep. 17, 2013.

Taiwan Office Action (with attached English translation) for Application No. 97108171; 12 total pages; Dec. 27, 2013.

* cited by examiner

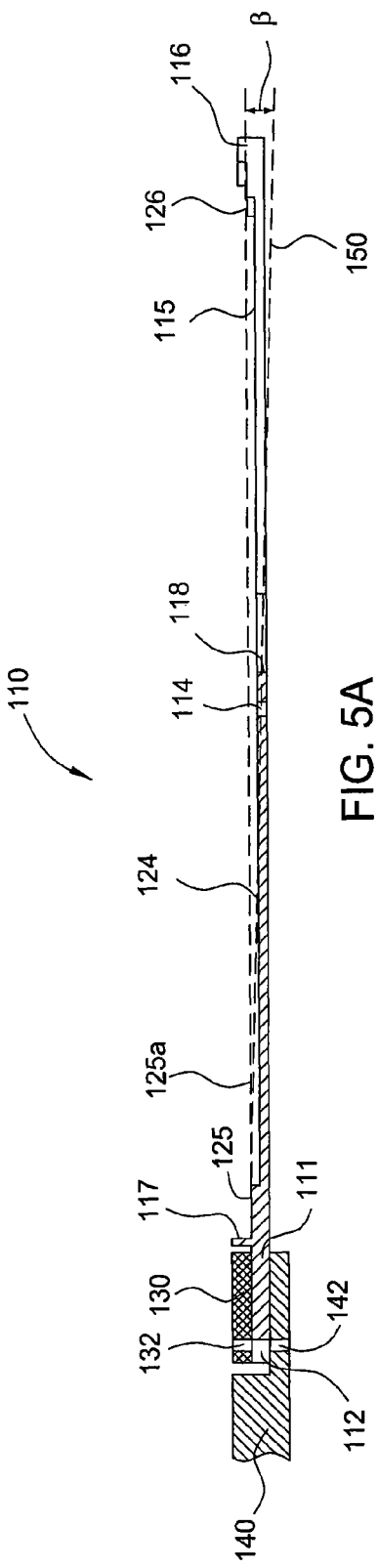
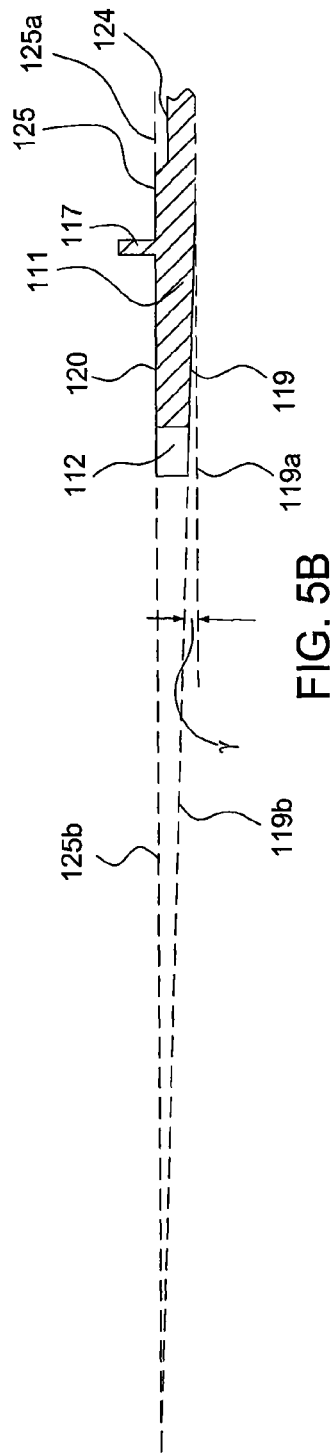
FIG. 5A
FIG. 5B

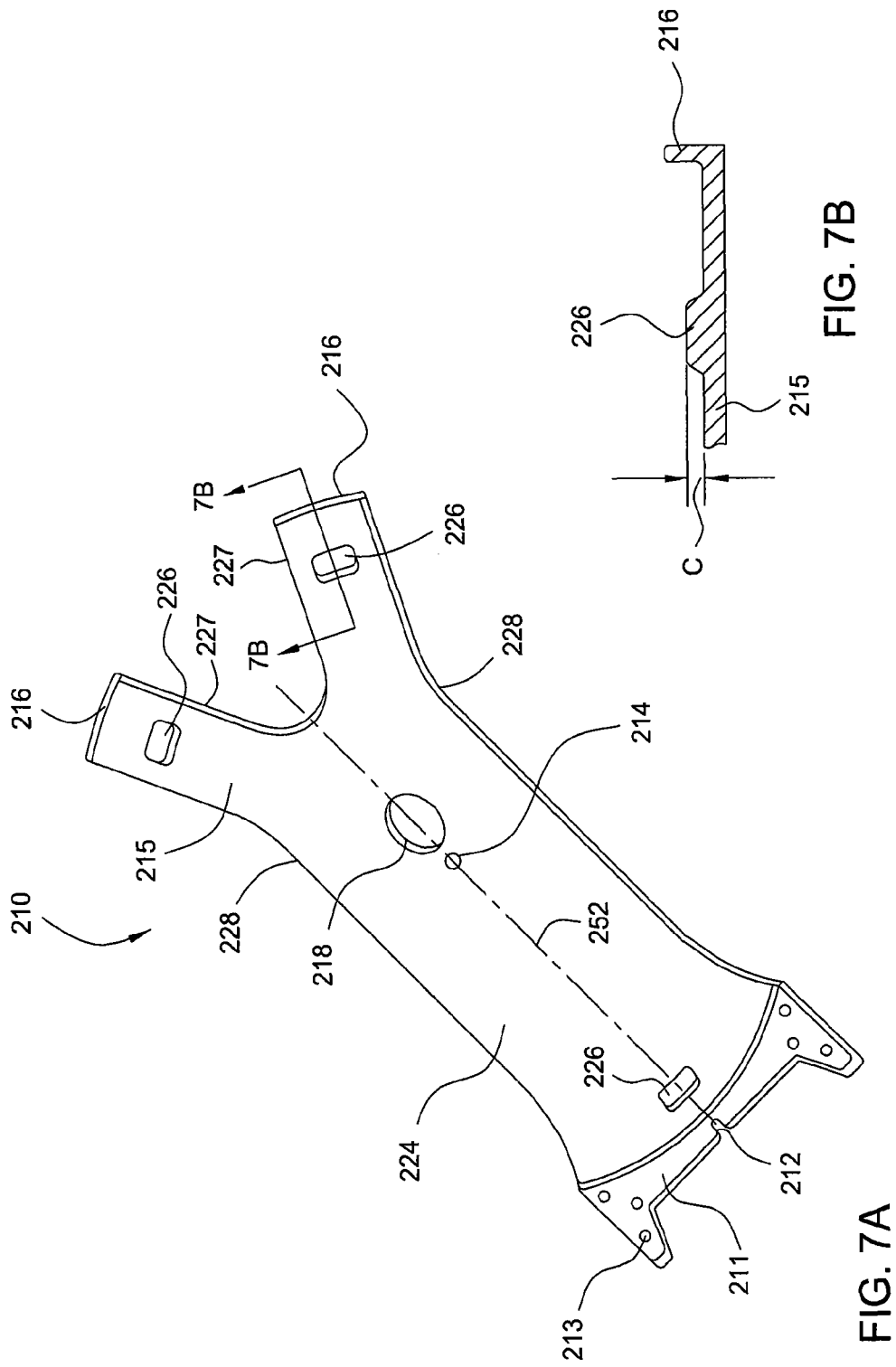

HIGH TEMPERATURE ANTI-DROOP END EFFECTOR FOR SUBSTRATE TRANSFER

CROSS-REFERENCE TO RELATED APPLICATIONS

This application claims priority to U.S. Provisional Patent Application Ser. No. 60/894,098, filed Mar. 9, 2007, entitled "High Temperature Anti-Droop Effector for Substrate Transfer", which is incorporated herein by reference.

BACKGROUND OF THE INVENTION

1. Field of the Invention

Embodiments of the present invention generally relate to handling and transfer semiconductor substrates during semiconductor processing. More particularly, embodiments of the present invention relate to end effectors for use with a robot for handling semiconductor substrates.

2. Description of the Related Art

The use of robot arms is a well established manufacturing expedient in applications where human handling is inadequate and/or undesired. For example, in the semiconductor manufacturing, robot arms are used to handle substrates during and between various steps to provide speed and reduce contamination.

A substrate handler used in semiconductor processing generally includes one or more end effectors, also known as a robot blade or a carrier, attached to a robot arm. The end effectors are configured to support a substrate during substrate transferring. For an integrated semiconductor processing system, a robot arm is generally disposed in a transfer chamber having facets to accommodate a plurality of processing chambers, and loading/unloading ports. During processing, the robot arm in the transfer chamber first loads a substrate to the end effector from a loading port. After retrieving the substrate to the transfer chamber, the robot arm feeds the substrate to a processing chamber connected to the transfer chamber. The robot arm drops the substrate on a substrate support in the processing chamber and retrieves the end effector. When the process is completed in the processing chamber, the robot arm is employed to retrieve the substrate from the substrate chamber and to shuttle the substrate to another processing chamber for the next processing step.

Some common transfer chambers have facets to accommodate four to six processing chambers. The processing chambers may include rapid thermal processing (RTP) chambers, physical vapor deposition (PVD) chambers, chemical vapor deposition (CVD) chambers, and etch chambers.

FIG. 1 schematically illustrates a substrate handler 10 configured for handling substrates in a transfer chamber. The substrate handler 10 includes two end effectors 14 attached to an arm assembly 16 attached to a rotating portion 18. During transferring, a substrate sits on the end effector 14. The end effector 14 has a fixed end 27 attached to a mounting interface 28 of the arm assembly 16, and a free end 29 configured to support a substrate thereon. The free end 29 may have a substrate sensing hole 15 configured to let through a sensor beam used to detect presence of a substrate. The arm assembly 16 moves the end effectors 14 radially outward from and inward to the substrate handler 10 to insert a substrate into or retrieve a substrate from a processing chamber.

The end effectors of prior art have several limitations. First, the end effector exhibits a droop (i.e. a tip-to-tail deflection) due to natural material compliance and weight of the substrate. Droop becomes more pronounced as the end effector becomes thinner to access densely packed substrates and as the size of the substrates become larger. FIG. 2A schematically illustrates a partial sectional side view of the end effector 14 without a substrate. FIG. 2B is a schematic sectional side view of the end effector 14 with a substrate 30 loaded thereon. An increased droop in the end effector 14 is shown due to weight of the substrate 30 positioned on the end effector 14. After the substrate 30 is loaded, the free end droops to an angle $\alpha$.

High precision is critical in semiconductor processing. It is critical for a substrate handler, therefore, an end effector, to have high precision alignment. The end effectors are generally aligned and tightly secured on the robot arm to prevent any unwanted moves, which may cause distortion due to thermal expansion. During some high temperature processes, such as rapid thermal annealing, the end effector may need to transfer a hot substrate or to operate in a hot chamber. The temperature may be up to 350° C. The tightly secured end effector may become deformed due to thermal expansion at such high temperature. FIG. 3 schematically illustrates a top view of the end effector 14 secured on the mounting interface 28 of the arm assembly 16. The fixed end 27 of the end effector 14 is snuggly fitted between sidewalls 31 of the mounting interface 28 to prevent any rotations. When the end effector 14 is made from material having a larger thermal expansion rate than the material of the mounting interface 28, the fixed end 27 of the end effector 14 may exhaust any tolerance in seams 32 and become deformed. Additionally, drooping also increases at higher temperature.

Therefore, there is a need for apparatus and methods for transfer a substrate at high temperature without drooping or otherwise deforming.

SUMMARY OF THE INVENTION

The present invention generally relates to apparatus and methods for transfer a substrate at high temperatures. Particularly, embodiments of the present invention relates to high temperature anti-droop end effectors for transferring semiconductor substrates.

One embodiment of the present invention provides an end effector for using with a substrate handler comprising a free end having a substrate supporting plane configured to support a substrate and positioned that substrate at a first angle relative to a horizontal plane, and a fixed end configured to be mounted to the substrate handler, wherein the end effector is mounted to the substrate handler at a position that the substrate supporting plane is at a second angle relative to the horizontal plane when no substrate is disposed on the free end, and the first angle is different from the second angle.

Another embodiment of the present invention provides an end effector for using with a substrate handler comprising a free end having a substrate supporting plane configured to support a substrate thereon, and a fixed end having a bottom plane configured to secure the fixed end on a mounting surface of the substrate handler, wherein the bottom plane is formed at an angle relative to the substrate supporting plane.

Yet another embodiment of the present invention provides a substrate handler comprising a motion arm having a mounting plate, and an end effector configured to support a substrate, wherein the end effector comprises a free end having a substrate supporting plane configured to support the substrate at a first angle relative to a horizontal plane, and a fixed end mounted to the mounting plate of the motion arm, wherein the end effector is mounted to the mounting plate at a position that the substrate supporting surface is at a second angle relative to the horizontal plane when no substrate is disposed on the free end, and the first angle is different from the second angle.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 5A-B schematically illustrate sectional side views of the end effector assembly of FIG. 4.

FIGS. 7A-B schematically illustrates an end effector in accordance with one embodiment of the present invention.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates apparatus and method for transferring semiconductor substrates. Embodiments of the present invention provide an end effector with anti-drooping and high temperature capabilities. In one embodiment of the present invention, an end effector may be mounted at a predetermined angle to counteract drooping caused by weight of the substrate and/or the end effector itself. In one embodiment, a slope is formed on a mounting end of the end effector to facilitate an angled mounting. In one embodiment of the present invention, an end effector is mounted to a robot arm with side tolerance to allow thermal expansion. In one embodiment, an end effector is secured to a robot arm near a center of a fixed end of the end effector. In one embodiment of the present invention, a clamp is used to secure an end effector to a robot arm.

Figure 1:
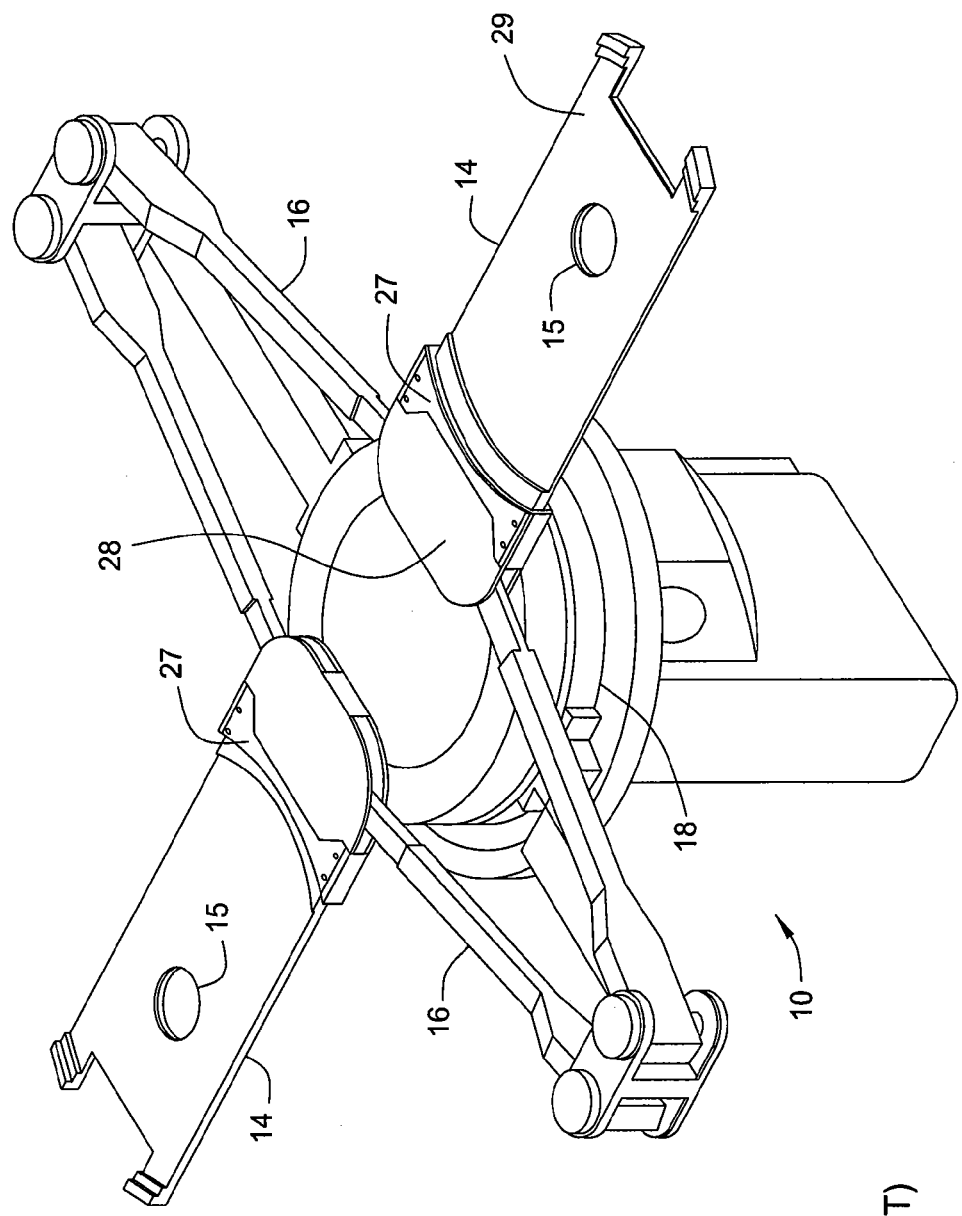
FIG. 1 (prior art) schematically illustrates a substrate handler configured for handling substrates in a transfer chamber.
Figure 2A:
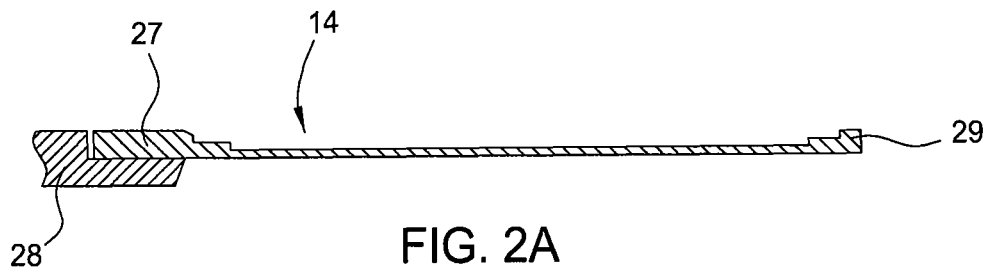
FIGS. 2A-B (prior art) schematically illustrate partial sectional side views of a drooping end effector.
Figure 2B:
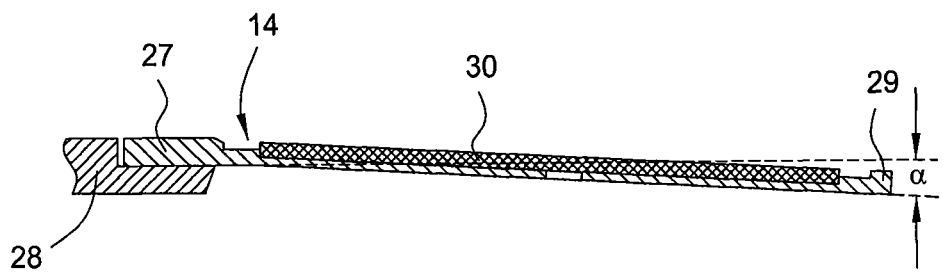
Figure 3:
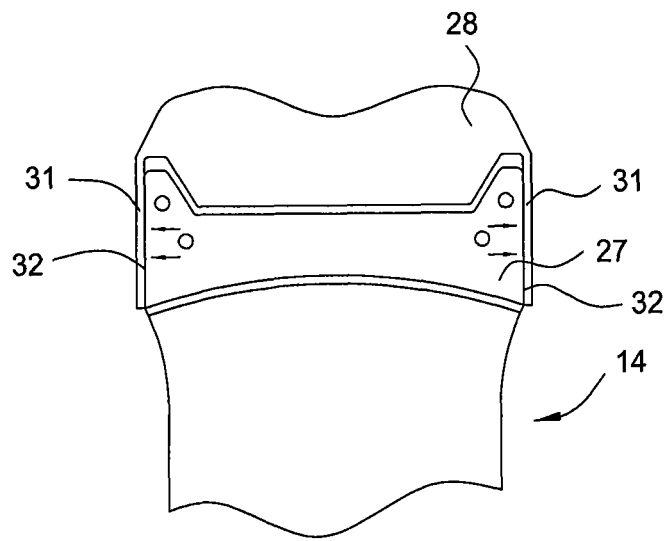
FIG. 3 (prior art) schematically illustrates a top view of an end effector that deforms at high temperature.
Figure 4:
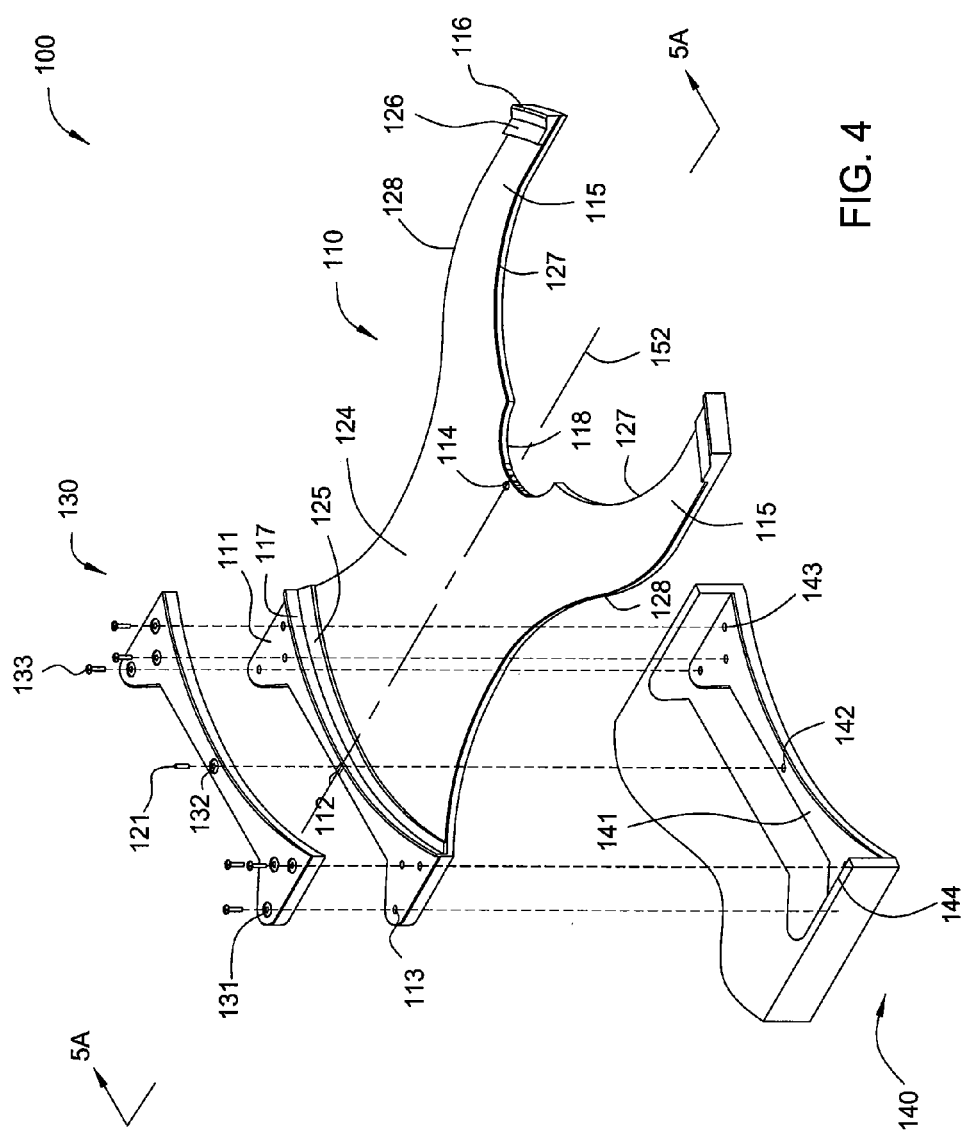
FIG. 4 schematically illustrates an exploded view of an end effector assembly in accordance with one embodiment of the present invention.

FIG. 4 schematically illustrates an exploded view of an end effector assembly 100 in accordance with one embodiment of the present invention. The end effector assembly 100 comprises an end effector 110 and a clamp 130 configured to secured the end effector 110 in a cavity 141 of a mounting plate 140 of a robot arm. In one embodiment, the mounting plate 140, the end effector 110 and the clamp 130 are stacked together using screws 133 through corresponding holes 143, 113, 131.

The end effector 110 has a free end 124 and a fixed end 111 configured for mounting the end effector 110 to the mounting plate 140. The fixed end 111 and the clamp 130 have similar shape of the cavity 141 so that both the fixed end 111 and the clamp 130 sit in the cavity 141.

The free end 124 has two fingers 115 defined by outer opposing edges 128 and inner facing edges 127. The end effector 110 has a substrate sensing cutout 118 at a standard location for permitting a sensor beam, such as an infrared beam, to detect the presence a substrate on the end effector 110. The end effector 110 also has a center-finder hole 114. An operator may open a chamber and insert a pin into the center-finder hole 114 to calibrate the center of the end effector 110, so that the end effector 110 may be properly aligned with the chamber when dropping off or picking up a substrate in the chamber.

The outer opposing edges 128 curve in a unique hour glass shape starting with the fixed end 111 of the end effector 110 and then taper out to form recesses. The inner facing edges 127 curve together to form a recess that extends into the area of the substrate sensing cutout 118. The recesses in the end effector 110 limit the mass of the end effector 110 to achieve lightweight and strong support for a substrate.

The end effector 110 has a shelf 125 formed near the fixed end 111, and shelves 126 formed near tips of the fingers 115. The shelves 125, 126 are configured to support a backside of a substrate and provide clearance for the backside of the substrate above the level of the main part of the free end 124. The shelves 125, 126 form a substrate supporting surface 125a configured to support the backside of the substrate. The end effector 110 also has end shoes 117, 116 configured for laterally containing a substrate therein.

In one embodiment of the present invention, the end effector 110 is mounted at a predetermined angle to counteract drooping. FIGS. 5A-B schematically illustrate sectional side views of the end effector assembly of FIG. 4.

As shown in FIG. 5A, the end effector 110 is "sandwiched" between the mounting plate 140 and the clamp 130. Dashed line 150 indicates a desired angle that a substrate is to be handled on the end effector 110. Usually, the desired angle is about zero degree, i.e. parallel, to a horizontal plane. In one embodiment, the end effector 110 is mounted such that the substrate supporting surface 125a is at a predetermined angle β relative to the desired angle marked by the dashed line 150. In one embodiment, the predetermined angle β is determined to compensate drooping of the end effector 110 due to the weight of a substrate so that when the substrate is positioned on the end effector 110, the substrate is parallel to the dashed line 150. Factors effect the predetermined angle β may comprise weight and size of the substrate, properties of the material of the end effector 110, structure of the end effector 110, and a temperature at which the substrate is to be transferred.

In one embodiment, the angled mounting shown in FIG. 5A may be achieved by forming a slope at a bottom surface 119 of the fixed end 111. As shown in FIG. 5B, the bottom surface 119 of the fixed end 111 may be sloped so that the bottom surface 119 and the substrate supporting surface 125a are not parallel. As shown in FIG. 5B, the bottom surface 119 extends to a bottom plane 119b. The substrate supporting surface 125a extends to a supporting plane 125b. The bottom plane 119b intersects the supporting plane 125b. A sloping angle γ, which is defined between the bottom plane 119a and an original bottom surface 119a, may be determined corresponding to the angle β. In one embodiment, the fixed end 111 may have a tapered shape with a top surface 120 parallel to the supporting plane 125b and the original bottom plane 119a, and the bottom surface 119 forms an angle of γ with the top surface 120.

In one embodiment, the angle γ may be determined by a displacement of the free end 124 when a substrate is positioned thereon. For example, the end effector 110 may be formed first without a slope on the bottom surface 119 and mounted on the mounting plate 140 so that the fixed end 111 is mounted substantially horizontal in a processing environment. Then a substrate can be positioned on the free end 124 and a total displacement of the free end 124 from the horizontal plane may be measured. The lope angle γ may be determined to correct the total displacement.

As such, end effectors of the present invention may be custom built with slopes of different angle γ for different process parameters, such as processing temperature, weight and size of substrates being processed, material and structure of the end effector. A substrate handler, such as a robot, may avoid drooping at different processes by using different end effectors.

In another embodiment, a slope may be formed on a top surface of the mounting plate 140 to mount the end effector 110 in a predetermined angle. In another embodiment, the mounting plate 140 may be positioned in a predetermined angle on the robot arm so that the end effector mounted on the mounting plate 140 is angled.

In one embodiment of the present invention, alignment between an end effector and a mounting plate of a substrate handler may be obtained using constraints near a center of a mounting region of the end effector. Referring back to FIG. 4, alignment of the end effector 110 may be achieved using an aligning notch 112 formed near a central line 152 of the fixed end 111. A centering hole 132 on the clamp 130 is aligned with a centering hole 142 formed on the mounting plate 140. A dowel pin 121 is used to thread the centering hole 132 of the clamp 130, the aligning notch 112 of the end effector 110, and the centering hole 142 of the mounting plate 140 when the end effector 110 is mounted.

Figure 6:
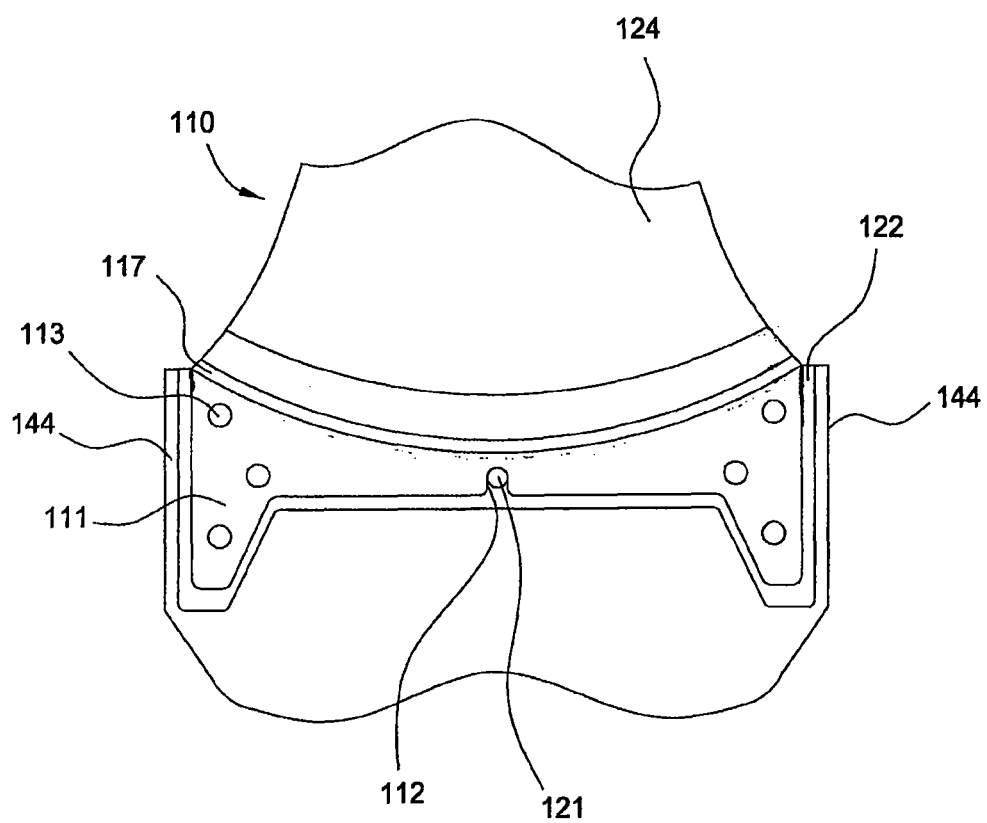
FIG. 6 schematically illustrates a partial top view of the end effector assembly of FIG. 4.

FIG. 6 schematically illustrates a top view of the end effector assembly 100 of FIG. 4 without the clamp 130. Because the alignment is obtained using the aligning notch 112 and the dowel pin 121, relief seams 122 may be made between side walls 144 of the mounting plate 140 and the fixed end 111 of the end effector 110. The relief seams 122 and the aligning notch 112 formed near the center of the fixed end 111 allow the fixed end 111 of the end effector 110 to expand inside the cavity 141 without distortion. This is particularly useful when the end effector 110 is made of a material with greater thermal expansion rate than the material of the mounting plate 140 and/or the clamp 130.

Even though, a dowel pin and a notch alignment is described in accordance with the present invention, other suitable alignment methods aligning an end effector near a center region of a fixed end is also contemplated.

End effectors of the present invention may be made from any suitable material that compatible with semiconductor processes to be performed in corresponding processing chambers. In one embodiment, the end effector is made from aluminum. In another embodiment, the end effector may be made with nickel plated aluminum. Other suitable materials may include titanium, stainless steel, and ceramic. Similarly, the clamp may be made from suitable materials such as titanium, aluminum, stainless steel and ceramic.

In one embodiment, the clamp 130 and the mounting plate 140 may be made from the same material so that the clamp 130 may be snuggly fitted in the cavity 141 of the mounting plate 140.

In one embodiment, an end effector is made from aluminum, while a clamp for mounting the end effector in a mounting plate is made from titanium.

FIGS. 7A-B schematically illustrates an end effector 210 in accordance with another embodiment of the present invention.

The end effector 210 having a free end 224 and a fixed end 211 configured for mounting the end effector 210 to a mounting plate. The fixed end 211 is similar to the fixed end 111 of the end effector 110 and may be mounted in a similar way. The fixed end 211 has an aligning notch 212 formed near a central line 252 of the end effector 210, and a plurality of through holes 213 for mounting screws.

The free end 224 has two fingers 215 defined by outer opposing edges 228 and inner facing edges 227. The end effector 210 has a substrate sensing hole 218 at a standard location for permitting a sensor beam, such as an infrared beam, to detect the presence a substrate on the end effector 210. The end effector 210 also has a center-finder hole 214. An operator may open the chamber and insert a pin into the center-finder hole 214 to calibrate the center of the end effector 210, so that the end effector 210 may be properly aligned with dropping off or picking up a substrate in the chamber.

The outer opposing edges 228 are substantially linear near the center portion forming a relatively robust free end 224, which provides stable support to a substrate.

The end effector 210 has three bump supports 226 formed on the free end 224. The three bump supports 226 form a three-point substrate support configuration for minimum contact with a substrate. The bump supports 226 may be machined on the free end 224 to provide clearance for an edge of the substrate from the free end 224. The end effector 210 also has end shoes 216 forming a circle larger than a substrate being transferred. The end shoes 216 are configured for laterally catching a substrate therein in emergency.

As shown in FIG. 7B, the bump supports 226 and the end shoes 216 may be formed with rounded corners to avoid scratching the substrate, thus, reducing particle contamination.

While the foregoing is directed to embodiments of the present invention, other and further embodiments of the invention may be devised without departing from the basic scope thereof, and the scope thereof is determined by the claims that follow.

What is claimed is:

1. An end effector for using with a substrate handler, comprising:
   a substantially flat body comprising:
     a free end having two or more supporting bumps, wherein the two or more supporting bumps form a substrate supporting plane configured to support a backside of a substrate; and
     a fixed end configured to be mounted to the substrate handler and allow the free end extending from the substrate handler, wherein the fixed end is tapered and has a sloped bottom surface for mounting the end effector on the substrate handler, when no substrate is present on the free end, the substrate supporting plane is at a first angle relative to the bottom surface and is not parallel to the bottom surface, when a substrate is present on the free end, the substrate supporting plane is at a second angle relative to the bottom surface, and the first angle is different from the second angle.

2. The end effector of claim 1, the first angle is predetermined by structure of the end effector, material of the end effector, size and weight of the substrate, or operating temperature.

3. The end effector of claim 1, wherein the fixed end has a top surface substantially parallel to the substrate supporting plane of the free end when no substrate is present on the free end, and the bottom surface forms an upward slope relative to the top surface of the fixed end.

4. The end effector of claim 3, wherein degree of the slope is corresponding to the difference between the first angle and the second angle.

5. The end effector of claim 1, wherein the free end comprises three supporting bumps configured to support the substrate thereon without contacting an edge of the substrate.

6. The end effector of claim 1, wherein the free end has end shoes configured to retain a substrate laterally.

7. The end effector of claim 1, wherein the fixed end has an aligning notch near a central line of the end effector, and the aligning notch is configured to align the end effector with the substrate handler.

8. An end effector for using with a substrate handler, comprising:
   a substantially flat body comprising:
      a free end having shelves forming a substrate supporting surface configured to support a backside of a substrate thereon and provide a clearance between the backside of the substrate and a main part of the free end; and
      a fixed end having a mounting surface configured to secure the end effector against the substrate handler, wherein the fixed end has an upward slope at the mounting surface so that the mounting surface and the substrate supporting surface are at a predetermined angle, the mounting surface and the substrate supporting surface are not parallel to each other when no substrate is present on the free end, and the predetermined angle is configured to correct displacement of the free end due to the presence of the substrate.

9. The end effector of claim 8, wherein the fixed end has an aligning notch formed near the central line of the end effector and configured to align the end effector with the substrate handler.

10. The end effector of claim 9, wherein the fixed end is configured to be disposed in a mounting cavity of a mounting plate of the substrate handler with an allowance to accommodate thermal expansion difference between the mounting plate and the end effector.

11. The end effector of claim 10, where the fixed end is aligned to the mounting plate by inserting a dowel pin through an aligning notch formed near the central line of the end effector and a centering hole formed in the mounting plate.

12. A substrate handler, comprising:
   a motion arm having a mounting plate; and
   an end effector coupled to the mounting plate along an upward slope and configured to support a substrate, wherein the end effector comprises a substantially flat body comprising:
      a free end having two or more supporting shelves, wherein the two or more supporting shelves form a substrate supporting plane configured to support a backside of the substrate; and
      a fixed end mounted to the mounting plate of the motion arm to allow the free end extending from the motion arm, wherein the fixed end is tapered and has a sloped bottom surface for mounting the end effector on the mounting plate, when no substrate is present on the free end, the substrate supporting plane is at a first angle relative to the bottom surface and is not parallel to the bottom surface, when a substrate is present on the free end, the substrate supporting plane is at a second angle relative to the bottom surface, and the first angle is different from the second angle.

13. The substrate handler of claim 12, further comprising a clamp member configured to mount the end effector on the mounting plate, wherein the end effector is stacked between the clamp member and the mounting plate.

14. The substrate handler of claim 12, wherein the fixed end has an aligning notch formed near a central line of the end effector, the aligning notch is configured to align the end effector with the mounting plate.

15. The substrate handler of claim 14, further comprising a dowel pin deposed through the aligning notch of the end effector and a centering hole formed in the mounting plate to align the end effector with the mounting plate, wherein the mounting plate has sidewalls and a mounting surface forming a cavity for receiving the fixed end of the end effector.

16. The substrate handler of claim 15, wherein a gap is present between the sidewalls of the cavity in the mounting plate and the end effector to allow thermal expansion of the end effector.

17. The substrate handler of claim 12, wherein the end effector and the mounting plate are made of different materials.

18. The substrate handler of claim 17, wherein the end effector is made of aluminum and the mounting plate is made of titanium.

* * * * *